US008435865B2

(12) United States Patent
Kodama

(10) Patent No.: US 8,435,865 B2
(45) Date of Patent: May 7, 2013

(54) METHOD OF MANUFACTURING SUPER-JUNCTION SEMICONDUCTOR DEVICE

(75) Inventor: Naoko Kodama, Nagano (JP)

(73) Assignee: Fuji Electric Co., Ltd., Kawasaki (JP)

( * ) Notice: Subject to any disclaimer, the term of this patent is extended or adjusted under 35 U.S.C. 154(b) by 0 days.

(21) Appl. No.: 13/110,426

(22) Filed: May 18, 2011

(65) Prior Publication Data

US 2011/0287617 A1 Nov. 24, 2011

(30) Foreign Application Priority Data

May 20, 2010 (JP) ................. 2010-116559

(51) Int. Cl.
*H01L 21/76* (2006.01)
*H01L 21/425* (2006.01)
*H01L 23/544* (2006.01)

(52) U.S. Cl.
USPC .... 438/401; 438/527; 257/797; 257/E23.179; 257/E21.057

(58) Field of Classification Search ............... 438/527
See application file for complete search history.

(56) References Cited

U.S. PATENT DOCUMENTS

| 5,436,173 | A | * | 7/1995 | Houston | 438/155 |
| 6,589,336 | B1 | * | 7/2003 | Ebara et al. | 117/94 |
| 2007/0267664 | A1 | * | 11/2007 | Sumi et al. | 257/288 |
| 2008/0248626 | A1 | * | 10/2008 | Liu et al. | 438/424 |

FOREIGN PATENT DOCUMENTS

| JP | 02-096328 | 4/1990 |
| JP | 05-343319 | 12/1993 |
| JP | 2001-139399 | 5/2001 |
| JP | 2003-007618 | 1/2003 |
| JP | 2008-130919 | 6/2008 |
| JP | 2009-188118 | 8/2009 |

* cited by examiner

*Primary Examiner* — Charles Garber
*Assistant Examiner* — Calvin Choi

(57) ABSTRACT

A method of manufacturing a super-junction semiconductor device facilitates suppressing the shape change caused in the alignment mark in the upper epitaxial layer transferred from the alignment mark in the lower epitaxial layer to be small enough to detect the transferred alignment mark with a few additional steps, even if the epitaxial layer growth rate is high. Alignment mark groups, each formed of trenches including parallel linear planar patterns and used in any of the multiple epitaxial layer growth cycles, are formed collectively on a scribe line between semiconductor chip sections; and the mesa region width between the trenches in each alignment mark group indicated by the distance between the single-headed arrows, facing opposite to each other and drawn in alignment mark groups is set to be one fourth of the designed total epitaxial layer thickness at the end of each epitaxial layer growth cycle or longer.

4 Claims, 4 Drawing Sheets

METHOD OF MANUFACTURING SUPER-JUNCTION SEMICONDUCTOR DEVICE

CROSS-REFERENCE TO RELATED APPLICATIONS

This application claims the priority benefit under 35 USC §119 of Japanese Patent Application No. 2010-116559, filed on May 20, 2010, in the Japanese Intellectual Property Office, the disclosure of which is incorporated herein by reference.

BACKGROUND

1. Field

The present invention relates to a method of manufacturing a semiconductor device that includes a drift layer formed of an alternating conductivity type layer including an n-type column and a p-type column, both extending in perpendicular to the major surface of a semiconductor substrate. The n-type column and the p-type column are arranged alternately and repeatedly in parallel to the major surface of a semiconductor substrate such that the n-type column and the p-type column are adjoining to each other. Hereinafter, "super-junction" refers to the alternating conductivity type layer, and "super-junction semiconductor device" refers to the semiconductor device including an alternating conductivity type layer.

2. Description of the Related Art

A super-junction MOSFET (hereinafter referred to as a "SJ-MOSFET") that is a vertical power MOSFET including a drift layer provided with a super-junction structure is one known super-junction semiconductor device.

In FIG. 6, a cross sectional view of a SJ-MOSFET, the drift layer thereof provided with a super-junction structure is formed of alternating conductivity type layer 104 including n-type column 101 and p-type column 103, both extending in perpendicular to the major surface of heavily doped n$^+$ silicon semiconductor substrate 100. The n-type column 101 and p-type column 103 are arranged alternately and repeatedly in parallel to the major surface of heavily doped n$^+$ silicon semiconductor substrate 100. The SJ-MOSFET also includes p-type base region 105, n-type source region 106, gate insulator film 107, polysilicon gate electrode 108, interlayer insulator film 109 made from boro-phosphosilicate glass (BPSG), source electrode 110, surface protector film 111, and drain electrode 112.

Even if the impurity concentrations in the p-type and n-type columns are set to be higher than the impurity concentrations in the usual power semiconductor device of the same breakdown voltage class, depletion layers expand from the pn-junction between the p-type and n-type columns to both sides in the OFF-state of the device, depleting the p-type and n-type columns at a low electric field strength. Therefore, it is possible to provide the super-junction semiconductor device with a higher breakdown voltage.

As a result, the super-junction semiconductor device exhibits excellent semiconductor device performances. In detail, the super-junction semiconductor device facilitates reducing the ON-state resistance, that is in the tradeoff relation against the breakdown voltage, to a value not only low enough to transcend the tradeoff relation but also low enough to transcend the theoretical limit of the material.

For manufacturing the super-junction structure, the method combining a multi-step epitaxial growth and ion implantation (hereinafter referred to simply as the "multi-step epitaxial growth method") has been developed and the SJ-MOSFETs having the super-junction structure formed by the multi-step epitaxial growth method are manufactured.

In detail, an n$^-$ layer (not shown) that will work as a buffer layer is formed on heavily doped n$^+$ silicon semiconductor substrate 100 in FIG. 6. Then, a trench having a side wall perpendicular to the substrate surface is formed by anisotropic dry-etching and such an etching technique as an alignment mark used for positioning in the subsequent steps in the section on the n$^-$ layer surface (not shown), in which a scribe line is planned.

Then, a non-doped epitaxial layer is grown, an n-type ion-implanted region is formed, a photoresist is patterned using the alignment mark, and a p-type ion-implanted region is formed by selective ion implantation through the photoresist opening. The step of growing a non-doped epitaxial layer, the step of forming an n-type ion-implanted region, and the step of forming a p-type ion-implanted region are repeated a predetermined number of times such that an upper p-type ion-implanted region is positioned on the lower p-type ion-implanted region.

As described above, the multi-step epitaxial growth method is a method that repeats the steps of growing a non-doped epitaxial layer, patterning a resist, and implanting impurity ions to pile up p-type ion-implanted regions and n-type ion-implanted regions in the same respective sites. Then, the multi-step epitaxial growth method thermally drives the p-type and n-type ion-implanted regions to expand and connects the p-type ion-implanted regions and the n-type ion-implanted regions in perpendicular to the substrate major surface, for forming an alternating conductivity type layer.

It is important for the multi-step epitaxial growth method to position the ion-implanted region of a conductivity type in the upper layer exactly on the ion-implanted region of the same conductivity type in the lower layer. Since the alignment mark described above is necessary as a reference for the exact positioning, it is required for the alignment mark to have a clear shape.

In growing an epitaxial layer on the silicon wafer 120, in which a trench-shaped alignment mark is formed, the trench pattern for the alignment mark will be deformed if the growth rate is too high. The trench pattern for the alignment mark is deformed, for example, as follows. As silicon epitaxial layer 122 is grown on the alignment mark shaped with trench 121 (the cross sectional view thereof is shown in FIG. 2(a)), the alignment mark is deformed, as schematically described in FIG. 2(b), such that what is left is not any horizontally flat section, left but a triangular cross section or a curved cross section (not shown) caused in the alignment mark. The alignment mark's lack of any horizontally flat section tends to be caused when the silicon epitaxial layer 122 growth rate is high.

If a pattern similar to trench 121, formed before silicon epitaxial layer 122 is grown, is not formed in the silicon epitaxial layer 122 surface but the deformed pattern as described above is caused in silicon epitaxial layer 122, it will be difficult to automatically detect the alignment mark with a detector and the alignment will be conducted hardly or an alignment deviation will be caused.

If an alignment deviation is caused, the ion-implanted regions of the same conductivity type in the upper and lower layers will deviate easily from each other, the columnar regions in the alternating conductivity type layer will be extended neither in perpendicular to the substrate surface nor straightly, and the semiconductor device performances will be impaired.

In the multi-step epitaxial growth, an epitaxial layer is grown repeatedly many times and the treatment steps also tend to be repeated many times. For reducing the treatment steps, it is preferable to form an alignment mark in a wafer, to grow an epitaxial layer on the wafer with the alignment mark formed therein and to conduct next patterning using the alignment mark transferred to the epitaxial layer without correction. It is also desirable for the epitaxial growth rate to be fast as much as possible from the view point of efficient manufacture. If an alignment mark pattern deformation after the epitaxial layer growth is expected, it will be necessary to correct the alignment mark size appropriately. If an alignment mark pattern deformation too large to correct is caused, it will be necessary to add the step of forming an alignment mark again. Alignment mark size correction or alignment mark reformation is not preferable, since manufacturing costs soar.

In view of such problems caused by the multi-step epitaxial growth method, Japanese Unexamined Patent Application Publication No. Hei. 5 (1993)-343319 proposes the following countermeasures. An epitaxial layer is grown multiple times on a heavily doped $n^+$ silicon semiconductor substrate. As for the alignment marks formed in the surface portions of the respective epitaxial layers for patterning the ion-implanted regions of a conductivity type and for piling up the ion-implanted regions of the same conductivity type exactly, a new alignment mark used for patterning the second epitaxial layer surface is formed at a position different from the position at which the alignment mark used for patterning the first epitaxial layer surface is formed. The new alignment mark improves the accuracy of aligning the ion-implanted regions of the same conductivity type rather than using the alignment mark transferred to the second epitaxial layer from the first epitaxial layer.

JP No. Hei. 5 (1993)-343319 also describes an etching method for sharpening the boundary of the transferred alignment mark blunted by every epitaxial layer growth to be clear enough for a next mask alignment.

Japanese Unexamined Patent Application Publication No. 2008-130919 describes the preferable use of KOH for an etchant that corrects the blunted alignment mark boundary to be sharp.

Japanese Unexamined Patent Application Publication No. 2009-188118 discloses that it is effective to set the alignment mark pitch to be from 8 µm to 10 µm for securing an automatic alignment mark detection, when an epitaxial layer of 20 µm in thickness is grown. In one of its drawings, an alignment mark of 4 µm×4 µm size is described at a pitch of 10 µm. The drawing indicates that the mesa region is 6 µm in width.

For the manufacture of a super-junction structure by the multi-step epitaxial growth method, it is important to prevent the ion-implanted region of a conductivity type in the upper epitaxial layer from deviating from the ion-implanted region of the same conductivity type in the lower epitaxial layer. However, the alignment mark shape deforms more depending on the epitaxial growth conditions as more epitaxial layers are deposited, resulting in a deformation too large to detect the alignment mark exactly. If the alignment mark is not detected exactly, it will be impossible to align the ion-implanted region of a conductivity type in the upper epitaxial layer on the ion-implanted region of the same conductivity type in the lower epitaxial layer properly.

In the situation described above, it will be possible to detect the alignment mark and to align the ion-implanted region in the upper epitaxial layer on the ion-implanted region in the lower epitaxial layer properly, if the deformed alignment mark size is corrected as described in JP No. Hei. 5 (1993)-343319. However, it becomes necessary to add the step of correcting the deformed alignment mark size.

It is possible to sharpen the blunted alignment mark boundary by the etching with KOH so that an alignment may be successful. It is also possible to form a new alignment mark so that an alignment may be successful. However, it will be necessary to add the step of new resist patterning or to add the step of etching to form a trench, if any of the methods described above is employed.

If the epitaxial layer growth rate is made to be low, the alignment mark will not be blunted nor deformed so much. However, since the epitaxial layer growth is repeated more times to obtain a higher breakdown voltage, the lower epitaxial growth rate impairs the manufacturing efficiency. Therefore, the lower epitaxial growth rate is not preferable.

In view of the foregoing, it would be desirable to obviate the problems described above. It would be also desirable to provide a method of manufacturing a super-junction semiconductor device that facilitates reducing the additional manufacturing steps. It would be further desirable to provide a method of manufacturing a super-junction semiconductor device that facilitates suppressing the shape change caused in the transferred alignment mark to be small enough, even if the epitaxial layer growth rate is high, such that the transferred alignment mark is detectable, when the alignment mark in the lower epitaxial layer is transferred to the upper epitaxial layer surface.

SUMMARY

According to an aspect of the invention, there is provided a method of manufacturing a super-junction semiconductor device, the method including the steps of:

(a) forming an alignment mark in a semiconductor substrate having a major surface coinciding with the (001) plane, the alignment mark including a trench having a side wall perpendicular to the substrate major surface;

(b) growing an epitaxial layer above the semiconductor substrate;

(c) patterning a resist using the alignment mark transferred to the surface of the epitaxial layer;

(d) implanting p-type ions and n-type ions;

(e) repeating a cycle including the steps (b) through (d) multiple times;

(f) conducting a thermal treatment for forming an alternating conductivity type layer including a p-type column and an n-type column, both extending in perpendicular to the substrate major surface, the p-type column and the n-type column being arranged alternately and repeatedly in parallel to the substrate major surface such that p-type column and the n-type columns are adjoining to each other; and the step (a) including:

providing the alignment mark with a trench structure including parallel linear planar patterns, forming the alignment marks used in the multiple times of the cycles collectively at different positions, and setting the mesa region width between the adjacent trenches in the trench structure used for the alignment mark in each cycle to be one-fourth of the designed total epitaxial layer thickness at the end of the step (b) in each cycle or longer.

Preferably, the mesa region width between the adjacent trenches in the trench structure used for the alignment mark in each cycle is set to be one-third of the designed total epitaxial layer thickness at the end of the step (b) in each cycle or longer.

Preferably, the side wall of the trench in the alignment mark is the (110) plane or the (1-10) plane.

According to embodiments of the invention, a method of manufacturing a super-junction semiconductor device, that facilitates suppressing, with a few additional steps, the shape change caused in the alignment mark in the upper epitaxial layer transferred from the alignment mark in the lower epitaxial layer to be small enough to detect the transferred alignment mark, even if the epitaxial layer growth rate is high, is obtained.

BRIEF DESCRIPTION OF THE DRAWINGS

These and/or other aspects and advantages will become apparent and more readily appreciated from the following description of embodiments, taken in conjunction with the accompanying drawings of which.

DESCRIPTION OF EMBODIMENTS

Now, embodiments of the invention will be described in detail hereinafter with reference to the accompanied drawings which illustrate the preferred embodiments of the invention. Although embodiments will be described in connection with a SJ-MOSFET exhibiting a breakdown voltage of 600 V, changes and modifications are obvious to the persons skilled in art without departing from the true spirits of the invention. Therefore, the invention is to be understood not by the specific descriptions herein but by the appended Claims thereof.

Figure 1A:
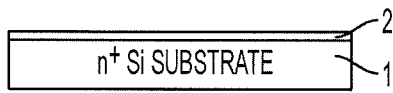
FIG. 1(a) is a first cross sectional view describing the manufacturing process for manufacturing a super-junction semiconductor substrate according to one embodiment of the invention.

Referring to FIG. 1(a), lightly doped n⁻ epitaxial layer 2, that will be a buffer layer, is formed on heavily doped n⁺ silicon semiconductor substrate 1, the major surface thereof is the (001) plane and the thickness thereof is 625 μm. In FIGS. 1(a), 1(b), 1(c), 1(d), and 1(e), n⁺ silicon semiconductor substrate 1 is represented by "n⁺ Si substrate." The laminate including n³⁰ silicon semiconductor substrate 1, the surface thereof is treated, and an epitaxial layer or epitaxial layers deposited through the subsequent steps will be collectively referred to sometimes as the "wafer."

Figure 1B:
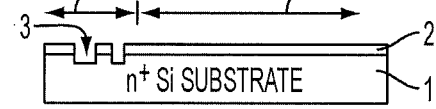
FIG. 1(b) is a second cross sectional view describing the manufacturing process for manufacturing the super-junction semiconductor substrate according to one embodiment.

Referring now to FIG. 1(b), alignment mark 3 having a trench structure including parallel linear planar patterns is formed on scribe line 5 between semiconductor chip sections 4. The trench in the trench structure is formed through n⁻ epitaxial layer 2 in the wafer surface portion such that the trench side walls are the (110) and (1-10) planes.

Figure 1C:
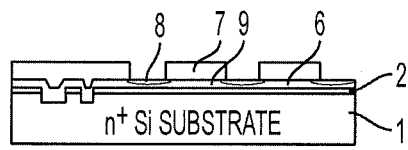
FIG. 1(c) is a third cross sectional view describing the manufacturing process for manufacturing the super-junction semiconductor substrate according to one embodiment.

Referring now to FIG. 1(c), phosphorus-ion-implanted region 9 is formed on the wafer by growing non-doped epitaxial layer 6 and by implanting phosphorus ions through the entire non-doped epitaxial layer 6 surface. Resist 7 for selective boron ion implantation is patterned. Then, boron ions are implanted selectively using resist 7 for a mask at the dose amount of $1.0 \times 10^{13}$ cm$^{-2}$ to form boron-ion-implanted region 8.

Figure 1D:
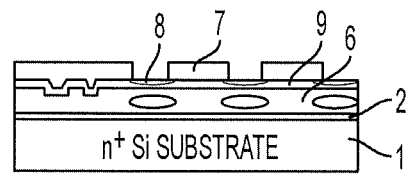
FIG. 1(d) is a fourth cross sectional view describing the manufacturing process for manufacturing the super-junction semiconductor substrate according to one embodiment.

Referring now to FIG. 1(d), the step of growing non-doped epitaxial layer 6, the step of forming phosphorus-ion-implanted region 9, the step of patterning resist 7 for selective boron ion implantation, and the step of implanting boron ions at the dose amount of $1.0 \times 10^{13}$ cm$^{-2}$ for forming selective boron-ion-implanted region 8 are repeated multiple times.

Figure 1E:
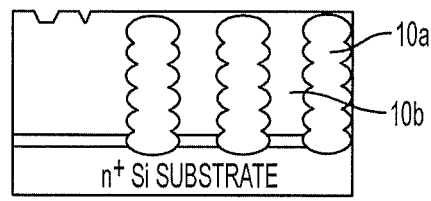
FIG. 1(e) is a fifth cross sectional view describing the manufacturing process for manufacturing the super-junction semiconductor substrate according to one embodiment.
Figure 2A:
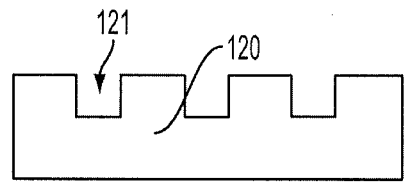
FIG. 2(a) is a cross sectional view describing a trench-shaped alignment mark schematically.
Figure 2B:
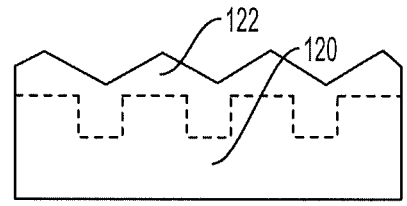
FIG. 2(b) is a cross sectional view describing a deformed trench-shaped alignment mark schematically.

Referring now to FIG. 1(e), a thermal diffusion is conducted, after the preceding steps are repeated multiple times, to connect the ion-implanted regions vertically such that p-type column 10a and n-type column 10b, both 50 μm in depth, are formed. If a SJ-MOSFET that includes a drift layer formed of an alternating conductivity type layer including p-type column 10a and n-type column 10b, both 50 μm in depth, is formed, a breakdown voltage of the 600 V class will be obtained.

Figure 3A:
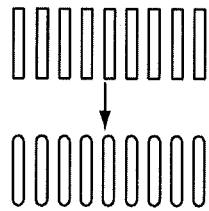
FIG. 3(a) describes the long-sided trenches and the deformation thereof caused by the epitaxial growth.
Figure 3B:
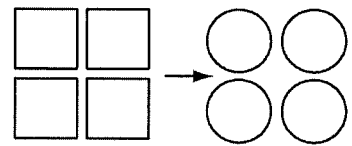
FIG. 3(b) describes the square trenches and the deformation thereof caused by the epitaxial growth.
Figure 3C:
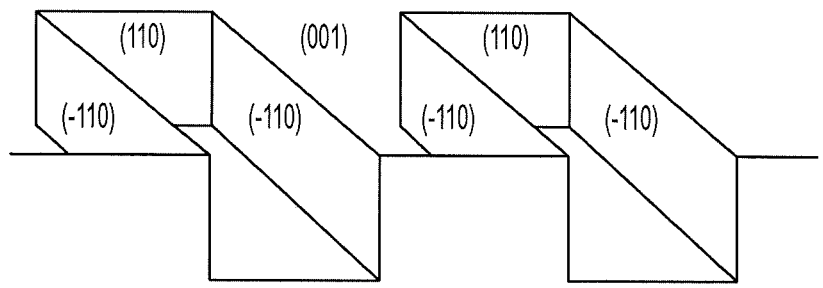
FIG. 3(c) is the oblique view of the trenches with the plane indices of the trench side walls described thereon.

Now the reason why alignment mark 3 in the n⁻ epitaxial layer 2 surface is preferable will be described with reference to FIGS. 3(a), 3(b), and 3(c). Alignment mark 3 has the trench structure including parallel linear planar patterns formed of the trench side walls, which are the (110) and (1-10) planes.

When an epitaxial layer is grown on the wafer, in which an alignment mark having a trench structure is formed, the epitaxial layer growth rates on the trench side walls are different depending on the crystal planes thereof. Therefore, the trench changes the shape thereof greatly as the epitaxial layer grows. FIG. 3(a) describes the planar pattern of a trench having side walls, the crystal planes thereof are described in FIG. 3(c). In the trench described in FIG. 3(a), the trench end portion on the (110) plane tends to curve as the epitaxial layer grows but the deformation on the (-110) plane is relatively small. The trench having a square planar pattern as described in FIG. 3(b) tends to deform to a circular one. Based on the results described above, a trench, the short vertical side wall thereof is the (110) plane and the long vertical side wall thereof is the (-110) plane, is employed, when the epitaxial layer major surface is the (001) plane.

It is harder to feed the raw material gas for the epitaxial growth uniformly on the trench side wall than on the flat surface. Although affected by the aspect ratio, the epitaxial layer tends to grow faster in the trench opening or in the trench bottom. When the flat surface is the (001) plane, a larger pattern deformation will be caused by the epitaxial growth on the long trench side wall slanting to the (-110) plane as compared with the epitaxial growth on the long trench side wall that is the (-110) plane. In short, the epitaxial growth on the long trench side wall slanting to the (-110) plane is not preferable. Therefore, the trench, the long side wall thereof is the (-110) plane, that is perpendicular to the epitaxial layer, the major surface thereof is the (001) plane, is employed.

In repeating the epitaxial growth and the resist patterning in subsequent to the alignment mark 3 formation according to the first embodiment, the accumulated film thickness accumulated by every epitaxial growth is 10 µm. Therefore, the accumulated film thickness after two cycles of epitaxial growth and resist patterning (hereinafter referred to simply as "cycles") is 20 µm, 30 µm after three cycles, 40 µm after four cycles, and 50 µm after five cycles.

It has been found that the alignment mark will be detected securely and the patterning will be accurate, if the mesa region width between the adjacent trenches in the trench structure formed of parallel linear planar patterns used for the alignment mark in every patterning is set to be one-fourth of the accumulated film thickness. The results are described in FIG. 4.

Figure 4:
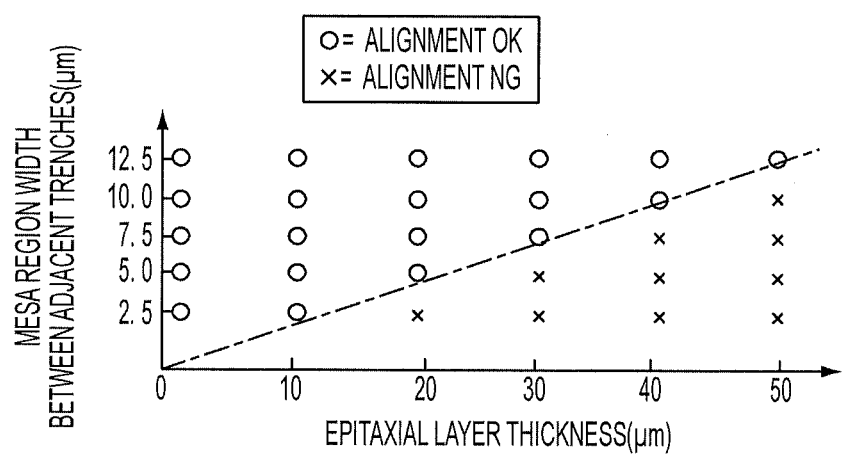
FIG. 4 describes whether the accurate resist pattern alignment is possible (OK) or not (NG) depending the one-fourth of the accumulated epitaxial layer thickness and the mesa region width between the adjacent trenches.

FIG. 4 describes whether the accurate resist pattern alignment is possible (OK) or not (NG) depending on the accumulated epitaxial layer thickness and the mesa region width between the adjacent trenches. In FIG. 4, the horizontal axis represents the accumulated epitaxial layer thickness and the vertical axis the mesa region width between the adjacent trenches. In FIG. 4, "possible" (OK) is indicated by ○ and "not" (NG) by x. The single-dotted chain line indicates the boundary between the OK and NG alignments.

As FIG. 4 indicates, the alignments will be all OK, if the mesa region width between the adjacent trenches is set to be one-fourth of the accumulated epitaxial layer thickness or longer. The one-fourth of the accumulated epitaxial layer thickness is the boundary, beyond which a flat plane is remaining in the mesa region between the adjacent trenches. If a flat plane is remaining in the mesa region between the adjacent trenches, the alignment mark will be detected automatically with a detector and the alignment will be OK.

In applying the results described in FIG. 4 in practice, the mesa region width is set to be longer than the indication by the single-dotted chain line in FIG. 4 according to this embodiment considering the deviations and errors. In detail, the mesa region width is set to be 4 µm, 7 µm, 10 µm, 15 µm, and 25 µm corresponding to the one-third of the accumulated epitaxial layer thickness or longer.

Figure 5:
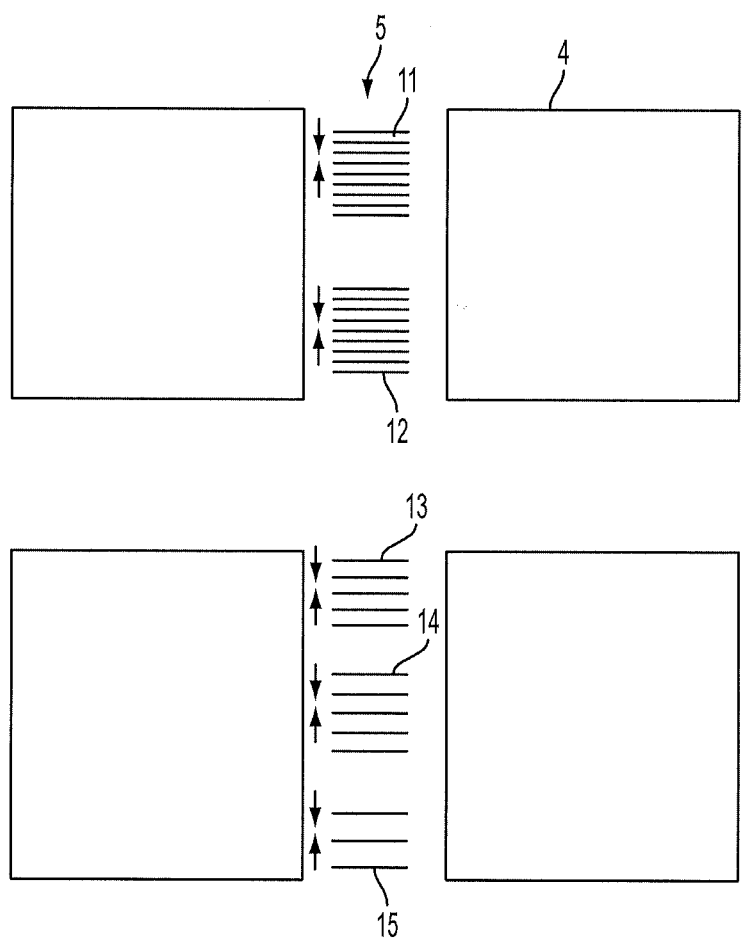
FIG. 5 is the top plan view of a silicon substrate describing the collective arrangements of trench-shaped alignment marks on a scribe line.

According to one embodiment, five groups of alignment marks 11, 12, 13, 14, and 15 are formed collectively before the epitaxial layer growth on scribe line 5 between semiconductor chip sections 4 as shown in FIG. 5, which is a top plan view describing the alignment mark arrangements. In each alignment mark group 11, 12, 13, 14, or 15, the mesa region width is set as described above. In detail, the distances between the single-headed arrows, facing opposite to each other and drawn in alignment mark groups 11 through 15, are 4 µm, 7 µm, 10 µm, 15 µm, and 25 µm.

The first through fifth epitaxial layers are grown, phosphorus ions are implanted through the entire surfaces of the first through fifth epitaxial layers, and boron ions are implanted selectively using the resist masks obtained by patterning the resists using the alignment marks 11 through 15 shown in FIG. 5 and transferred to the surfaces of the first through fifth epitaxial layers. Then, the impurities in the phosphorus- and boron-implanted regions are diffused thermally to form n-type columns and p-type columns.

Figure 6:
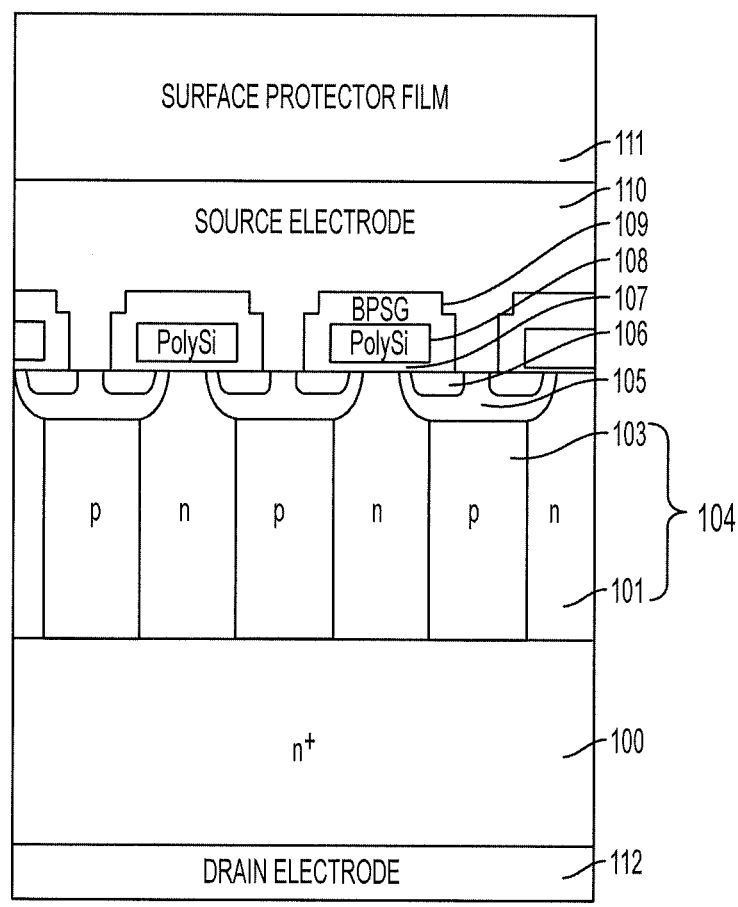
FIG. 6 is the cross sectional view of a SJ-MOSFET.

The subsequent manufacturing steps are the same with the manufacturing steps for forming the conventional planar MOS structure. A field oxide film is formed by thermal oxidation, a gate oxide film is formed, and gate polysilicon is formed. Using alignment mark 15, the gate polysilicon is patterned, and boron ions are implanted using the patterned polysilicon as a mask. Further, p-type base region 105 is formed by thermal diffusion. Thus, it is possible to align p-type column 103, n-type column 101, and p-type base region 105 exactly. Further, n-type source region 106, interlayer insulator film (BPSG) 109, source electrode 110, and surface protector film 111 are formed. Finally, the wafer 100 back surface is polished and drain electrode 112 is formed to complete the wafer process for manufacturing the SJ-MOSFET exhibiting a breakdown voltage of 600 V and shown in FIG. 6.

According to the one embodiment of the invention, the step of forming an alignment mark is conducted only once, even if the epitaxial layer growth rate in manufacturing a SJ-MOSFET by the multi-step epitaxial growth method is increased. Therefore, the manufacturing process may be shortened.

Although a few embodiments have been shown and described, it would be appreciated by those skilled in the art that changes may be made in these embodiments without departing from the principles and spirit of the invention, the scope of which is defined in the claims and their equivalents.

What is claimed is:

1. A method of manufacturing a super-junction semiconductor device, the method comprising:
   forming an alignment mark in a semiconductor substrate comprising a major surface coinciding with an (001) plane, the alignment mark comprising a trench having a side wall perpendicular to the substrate major surface;
   growing an epitaxial layer above the semiconductor substrate;
   patterning a resist using the alignment mark transferred to a surface of the epitaxial layer;
   implanting p-type ions and n-type ions;
   repeating a cycle comprising the growing, the patterning, and the implanting multiple times; and
   conducting a thermal treatment for forming an alternating conductivity type layer comprising a p-type column and an n-type column, both extending in perpendicular to the substrate major surface, the p-type column and the n-type column being arranged alternately and repeatedly in parallel to the substrate major surface such that the p-type column and the n-type column are adjoining to each other,
   the forming comprising:
   providing the alignment mark with a trench structure comprising parallel linear planar patterns,
   forming the alignment marks used in the multiple times of the cycles collectively at different positions, and
   setting a mesa region width between adjacent trenches in the trench structure used for the alignment mark in each cycle to be at least one-fourth of a designed total epitaxial layer thickness at an end of the growing in said each cycle.

2. The method according to claim 1, wherein the mesa region width between the adjacent trenches in the trench structure used for the alignment mark in each cycle is set to be at least one-third of the designed total epitaxial layer thickness at the end of the growing in each said cycle.

3. The method according to claim 1, wherein the side wall of the trench in the alignment mark comprises a (110) plane or a (1-10) plane.

4. The method according to claim 2, wherein the side wall of the trench in the alignment mark comprises a (110) plane or a (1-10) plane.

* * * * *